United States Patent
Asenov

(10) Patent No.: US 9,269,804 B2
(45) Date of Patent: Feb. 23, 2016

(54) GATE RECESSED FDSOI TRANSISTOR WITH SANDWICH OF ACTIVE AND ETCH CONTROL LAYERS

(71) Applicant: Gold Standard Simulations Ltd., Glasgow, Scotland (GB)

(72) Inventor: Asen Asenov, Glasgow, Scotland (GB)

(73) Assignee: SemiWise Limited, Glasgow (GB)

(*) Notice: Subject to any disclaimer, the term of this patent is extended or adjusted under 35 U.S.C. 154(b) by 0 days.

(21) Appl. No.: 13/950,868

(22) Filed: Jul. 25, 2013

(65) Prior Publication Data

US 2014/0027818 A1    Jan. 30, 2014

Related U.S. Application Data

(60) Provisional application No. 61/676,936, filed on Jul. 28, 2012.

(51) Int. Cl.
| | |
|---|---|
| *H01L 29/66* | (2006.01) |
| *H01L 29/78* | (2006.01) |
| *H01L 29/786* | (2006.01) |

(52) U.S. Cl.
CPC .......... *H01L 29/78* (2013.01); *H01L 29/66666* (2013.01); *H01L 29/7848* (2013.01); *H01L 29/78684* (2013.01)

(58) Field of Classification Search
CPC .......................... H01L 29/66492; H01L 29/78
USPC ....................................................... 257/330
See application file for complete search history.

(56) References Cited

U.S. PATENT DOCUMENTS

| | | |
|---|---|---|
| 5,298,452 A | 3/1994 | Meyerson |
| 5,314,547 A | 5/1994 | Heremans et al. |
| 5,316,958 A | 5/1994 | Meyerson |

(Continued)

FOREIGN PATENT DOCUMENTS

| | | |
|---|---|---|
| EP | 0936676 | 8/1999 |
| EP | 936676 A2 * | 8/1999 |

(Continued)

OTHER PUBLICATIONS

"International Search Report and Written Opinion of the International Searching Authority Dated Nov. 9, 2012, International Application No. PCT/IB2012/001068", (Nov. 9, 2012).

(Continued)

*Primary Examiner* — Ajay K Arora
(74) *Attorney, Agent, or Firm* — Blakely Sokoloff Taylor & Zafman LLP

(57) ABSTRACT

The structure and the fabrication methods herein implement a fully depleted, recessed gate silicon-on-insulator (SOI) transistor with reduced access resistance, reduced on-current variability, and strain-increased performance. This transistor is based on an SOI substrate that has an epitaxially grown sandwich of SiGe and Si layers that are incorporated in the sources and drains of the transistors. Assuming a metal gate last complementary metal-oxide semiconductor (CMOS) technology and using the sidewall spacers as a hard mask, a recess under the sacrificial gate reaching all the way through the SiGe layer is created, and the high-K gate stack and metal gate are formed within that recess. The remaining Si region, having a precisely controlled thickness, is the fully depleted channel.

15 Claims, 7 Drawing Sheets

(56) References Cited

U.S. PATENT DOCUMENTS

| | | | |
|---|---|---|---|
| 6,180,978 | B1 | 1/2001 | Chatterjee et al. |
| 6,479,866 | B1 | 11/2002 | Xiang |
| 6,566,734 | B2 | 5/2003 | Sugihara et al. |
| 6,627,488 | B2 | 9/2003 | Lee |
| 6,630,710 | B1 | 10/2003 | Augusto |
| 6,667,200 | B2 | 12/2003 | Sohn et al. |
| 6,746,924 | B1 | 6/2004 | Lee et al. |
| 6,812,157 | B1 | 11/2004 | Gadgil |
| 7,023,068 | B1 | 4/2006 | Hopper et al. |
| 7,045,407 | B2 | 5/2006 | Keating et al. |
| 7,459,752 | B2 | 12/2008 | Doris et al. |
| 7,589,347 | B2 | 9/2009 | Nash et al. |
| 7,906,413 | B2 | 3/2011 | Cardone et al. |
| 8,273,617 | B2 | 9/2012 | Thompson et al. |
| 8,748,986 | B1 * | 6/2014 | Shifren et al. .............. 257/348 |
| 2001/0009292 | A1 | 7/2001 | Nishinohara et al. |
| 2002/0001930 | A1 | 1/2002 | Lee |
| 2002/0029372 | A1 | 3/2002 | Lee |
| 2002/0037619 | A1 | 3/2002 | Sugihara et al. |
| 2003/0211681 | A1 * | 11/2003 | Hanafi et al. .............. 438/200 |
| 2004/0201063 | A1 | 10/2004 | Fukuda |
| 2004/0206980 | A1 | 10/2004 | Cheong et al. |
| 2006/0022270 | A1 | 2/2006 | Boyd et al. |
| 2006/0046399 | A1 * | 3/2006 | Lindert et al. .............. 438/282 |
| 2006/0113605 | A1 * | 6/2006 | Currie .............. 257/368 |
| 2008/0001237 | A1 | 1/2008 | Chang et al. |
| 2008/0017887 | A1 | 1/2008 | Nagata et al. |
| 2009/0321820 | A1 | 12/2009 | Yamakawa |
| 2009/0321849 | A1 | 12/2009 | Miyamura et al. |
| 2010/0237433 | A1 | 9/2010 | Zampardi et al. |
| 2011/0073961 | A1 | 3/2011 | Dennard et al. |
| 2011/0074498 | A1 | 3/2011 | Thompson et al. |
| 2011/0212583 | A1 | 9/2011 | Neudeck |
| 2011/0260220 | A1 | 10/2011 | Chi et al. |
| 2013/0001706 | A1 * | 1/2013 | Haran et al. .............. 257/410 |

FOREIGN PATENT DOCUMENTS

| | | |
|---|---|---|
| WO | WO-2009/053327 | 4/2009 |
| WO | WO-2013/027092 | 2/2013 |

OTHER PUBLICATIONS

"International Search Report and Written Opinion of the International Searching Authority Dated Nov. 9, 2012, International Application No. PCT/IB2012/001069", (Nov. 9, 2012).

"International Search Report and Written Opinion of the International Searching Authority Dated Nov. 13, 2013, International Application No. PCT/IB2013/001637", (Nov. 13, 2013).

"Office Action Dated Aug. 13, 2013; U.S. Appl. No. 13/424,745", (Aug. 13, 2013).

"Office Action Dated Nov. 22, 2013; U.S. Appl. No. 13/424,727", (Nov. 22, 2013).

"Office Action Dated Oct. 24, 2013; U.S. Appl. No. 13/424,745", (Oct. 24, 2013).

Asenov, Asen , "Random Dopant Threshold Voltage Fluctuations in 50nm Epitaxial Channel MOSFETs: A 3D 'Atomistic' Simulation Study", *ESSDERC '98: 28th Conference on European Solid-State Devices, Bordeax, France*, (Sep. 8-10, 1998), pp. 300-303.

Asenov, Asen, et al., "Suppression of Random Dopant-Induced Threshold Voltage Fluctuations in Sub-0.1-μm MOSFET's with Epitaxial and σ-Doped Channels", *IEEE Transactions on Electron Devices*, vol. 46, No. 8, (Aug. 1999), pp. 1718-1724.

Bruel, M. , "Silicon on insulator material technology", *Electronics Letters*, vol. 31, No. 14, (Jul. 6, 1995), pp. 1201-1202.

Colinge, Jean-Pierre , "Hot-Electron Effects in Silicon-On-Insulator n-Channel MOSFET's", *IEEE Transactions on Electron Devices*, vol. ED-34, No. 10, (Oct. 1987), pp. 2173-2177.

Courtland, Rachel , "Start-up Seeks New Life for Planar Transistors, SuVolta is pursuing precision doping in its bid to compete with 3-D transistor technology", *ieee spectrum tech alert*, (Dec. 8, 2011), 3 pp. total.

Frank, Martin M., "High-k / Metal Gate Innovations Enabling Continued CMOS Scaling", *2011 Proceedings of the ESSCIRC*, (Sep. 12-16, 2011), pp. 50-58.

Fu, Y. , et al., "Subband structure and ionized impurity scattering of the two dimensional electron gas in σdoped field effect transistor", *Journal of Applied Physics*, vol. 78, No. 5, (Sep. 1, 1995), pp. 3504-3510.

Fujita, K., et al., "Advanced Channel Engineering Achieving Aggressive Reduction of $V_T$ Variation for Ultra-Low-Power Applications", *Electron Devices Meeting (IEDM), 2011 IEEE International*, (Dec. 2011), pp. 32.3.1-32.3.4.

Hokazono, Akira, et al., "25-nm Gate Length nMOSFET With Steep Channel Profiles Utilizing Carbon-Doped Silicon Layers (A P-Type Dopant Confinement Layer)", *IEEE Transactions on Electron Devices*, vol. 58, No. 5, (May 2011), pp. 1302-1310.

Kuhn, Kelin J., et al., "Process Technology Variation", *IEEE Transactions on Election Devices*, vol. 58, No. 8, (Aug. 2011), pp. 2197-2208.

Maleville, Christophe , "Extending planar device roadmap beyond node 20nm through ultra thin body technology", *2011 International Symposium on VLSI Technology, Systems and Applications (VLSI-TSA)*, (Apr. 25-27, 2011), pp. 1-4.

Markov, Stanislov , et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.

Meyer, J. E., et al., "High Performance, Low Power CMOS Memories Using Silicon-On-Sapphire Technology", *1971 International Electron Devices Meeting*, (1971), p. 44.

Noda, Kenji , et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.

Pawlak, B. J., et al., "Effect of amorphization and carbon co-doping on activation and diffusion of boron in silicon", *Applied Physics Letters*, 89, 062110, (2009), pp. 062110-1 to 062110-3.

Pawlak, B. J., et al., "Suppression of phosphorus diffusion by carbon co-implantation", *Applied Physics Letters*, 89, 062102, (2006), pp. 062102-1 to 062102-3.

Roy, G. , et al., "Random dopant fluctuation resistant 'bulk' MOSFETs with epitaxial delta doped channels", *Ultimate Integration in Silicon (ULIS) Conference, Glasgow, Scotland*(2007), 4 pp. total.

Takeuchi, Kiyoshi , et al., "Channel Engineering for the Reduction of Random-Dopant-Placement-Induced Threshold Voltage Fluctuation", *1997 International Electron Devices Meeting (IEDM)*, Technical Digest, (Dec. 7-10, 1997), pp. 841-844.

"Office Action Dated May 7, 2014; U.S. Appl. No. 13/424,727", (May 7, 2014).

"Office Action Dated Jul. 7, 2014; U.S. Appl. No. 13/424,745", (Jul. 7, 2014).

"Office Action Dated Jul. 7, 2014; U.S. Appl. No. 13/950,834", (Jul. 7, 2014).

"Office Action Dated Jul. 8, 2014; U.S. Appl. No. 13/950,810", (Jul. 8, 2014).

Asenov, Asen , "Random Dopant Induced Threshold Voltage Lowering and fluctuations in Sub-0.1 μm MOSFET's: A 3-D "Atomistic" Simulation Study", *IEEE Transactions on Electron Devices*, vol. 45, No. 12, (Dec. 1998), pp. 2505-2513.

"Notice of Allowance Dated Dec. 19, 2014; U.S. Appl. No. 14/323,177", (Dec. 19, 2014).

"Notice of Allowance Dated Nov. 14, 2014; U.S. Appl. No. 13/424,727", (Nov. 14, 2014).

"Office Action Dated Oct. 27, 2014; U.S. Appl. No. 13/950,834", (Oct. 27, 2014).

"Office Action Dated Oct. 3, 2014; U.S. Appl. No. 13/950,810", (Oct. 3, 2014).

Saraswat, Krishna C., "Shallow Junctions", downloaded from http://web.stanford.edu/class/ee311/NOTES/ShallowJunctions.pdf, (Apr. 10, 2006), pp. 1-20.

"Notice of Allowance Dated Jul. 7, 2015; U.S. Appl. No. 13/950,834", (Jul. 7, 2015).

"Office Action Dated Aug. 25, 2015; U.S. Appl. No. 13/424,745", (Aug. 25, 2015).

"Office Action Dated May 15, 2015; U.S. Appl. No. 13/950,810", (May 15, 2015).

"Office Action Dated May 8, 2015; U.S. Appl. No. 14/664,595", (May 8, 2015).

* cited by examiner

GATE RECESSED FDSOI TRANSISTOR WITH SANDWICH OF ACTIVE AND ETCH CONTROL LAYERS

CROSS-REFERENCE TO RELATED APPLICATIONS

This application claims the benefit of U.S. Provisional Patent Application No. 61/676,936 filed Jul. 28, 2012.

BACKGROUND OF THE INVENTION

1. Field of the Invention

The present invention generally relates to the manufacturing of metal-oxide-semiconductor field effect transistors (MOSFETs), and more particularly to fully depleted channel transistors fabricated in thin silicon films over a buried insulating layer with improved source drain characteristics, excellent electrostatic integrity and reduced statistical variability.

2. Prior Art

MOS transistors have long been troubled by the adverse effects of their underlying substrates, like parasitic capacitance and area-consuming isolation. In the earliest days of integrated circuit technology, the use of a thin film of silicon on a sapphire substrate was proposed as a solution to these problems. RCA Laboratories was an early proponent of this technology, as in Meyer, J. E.; Boleky, E. J.; "High performance, low power CMOS memories using silicon-on-sapphire technology," Electron Devices Meeting, 1971 International, vol. 17, p. 44, 1971. The basic ideas of this technology have evolved over the years driven by improvements in materials technology, and as less exotic substrates became practical, this technology became known as silicon-on-insulator (SOI). In the earliest implementations, the silicon was simply relatively thin, i.e., less than 1 micron thick, substrate with a conventional level of doping and a depletion layer beneath the transistor's gate thinner than the silicon thickness resulting in 'partially depleted' SOI (PD SOI). The un-depleted doped region beneath the gate of a PD SOI transistor proved to have its own disadvantages, largely caused by its tendency to charge and discharge resulting in step changes in the drain current. These problems became known as a "kink" effect, and it was closely tied to impact ionization in the transistor's channel and electron/hole trapping in the un-depleted part of the silicon under the channel.

The next stage in SOI evolution was the use fully-depleted silicon film (FD SOI). This was achieved by making the silicon beneath the gate so thin that there would be no region where there could be mobile carriers. Some of the early work was done at HP Laboratories and reported as Colinge, J.-P.; "Hot-electron effects in Silicon-on-insulator n-channel MOSFET's," Electron Devices, IEEE Transactions on, vol. 34, no. 10, pp. 2173-2177, October 1987. In this work, the silicon film is thinner by a factor of 10, only 100 nm thick.

The next step in fully depleted SOI technology has been prompted by the emergence of threshold voltage variations that are associated with the uncertainty of the number of discrete doping ions immediately beneath the gate. This uncertainty is similar to shot noise, because it is an irreducible, statistical uncertainty. For large devices, the counting uncertainty, roughly proportional to the square root of the total number of ions, was never a problem. However, in a world where devices have dimensions of the order of 30 nm, the total number of doping ions drops below 100, and the counting uncertainty is about 3%, rising to 10% for smaller devices. These deviations are devastating when billions of transistors are integrated into a single integrated circuit chip.

The immediate solution required eliminating all doping from the silicon layer, placing all the responsibility for threshold control on the relative work functions of the gate material, now a metal, and the thickness of the silicon film. This has been done with both planar and FinFET transistor structures. A good review of this work may be found in Kuhn, K. J.; Giles, M. D.; Becher, D.; Kolar, P.; Kornfeld, A.; Kotlyar, R.; Ma, S. T.; Maheshwari, A.; Mudanai, S.; "Process Technology Variation," Electron Devices, IEEE Transactions on, vol. 58, no. 8, pp. 2197-2208, August 2011.

Planar transistors at 32/28 nm CMOS technology generation made to have good electrostatic integrity and resistance to doping fluctuations have to employ extremely thin silicon layers, of the order of 7 nm or less, and they are fabricated over thin buried oxide layers, roughly 10 nm thick. This is discussed in detail in Maleville, C.; "Extending planar device roadmap beyond node 20 nm through ultra thin body technology," VLSI Technology, Systems and Applications (VLSI-TSA), 2011 International Symposium on, pp. 1-4, 25-27 April 2011. Layers in the sub-10 nm thickness ranges present manufacturing challenges, and the very thin layers affect performance because the parasitic series resistance in sources and drains cuts down on the transistors' gain figures. The limited number of dopants, particularly in the access regions below the spacer, also introduce access resistance and on current variability, S. Markov, B. Cheng, A. Asenov, "Statistical variability in fully depleted SOI MOSFETs due to random dopant fluctuations in the Source and drain extensions," IEEE Electron Dev. Let. Vol. 33, pp. 315-317 (March, 2012).

There have been a variety of publications that address the use of an undoped or lightly doped epitaxial channel region to mitigate the fluctuations associated with random doping variations. The publications include Takeuchi, K.; Tatsumi, T.; Furukawa, A.; "Channel engineering for the reduction of random-dopant-placement-induced threshold voltage fluctuation," Electron Devices Meeting, 1997. IEDM '97. Technical Digest., International, pp. 841-844, 7-10 Dec. 1997; Asenov, A.; Saini, S.; "Suppression of random dopant-induced threshold voltage fluctuations in sub-0.1-μm MOSFET's with epitaxial and δ-doped channels," Electron Devices, IEEE Transactions on, vol. 46, no. 8, pp. 1718-1724, August 1999; and Thompson; Scott E.; Thummalapally; Damodar R.; "Electronic Devices and Systems, and Methods for Making and Using the Same," U.S. Patent Application 2011/0074498, Mar. 31, 2011. All these publications address the use of epitaxy in the channels of bulk transistors.

FIG. 1 shows a schematic representation of conventional, fully-depleted silicon on insulator transistor. This figure is prior art. The transistor in FIG. 1 is fabricated on a substrate 10, with a buried oxide 11 separating all components of the transistor from the underlying substrate 10. The active region 13 is intentionally undoped or doped at a low level that permits the active region to be totally free of carriers when there is no applied voltage difference between the gate 15 and 16 and the source, one of either region marked 19. This is made possible because a metal gate 15 has been chosen to have a work function which establishes the appropriate electrostatic potentials within the silicon channel region 13. The gate region 16 is a robust material like polycrystalline silicon that permits fabrication of further structures like inter-layer dielectrics and contacts. Normally in the fabrication of such a transistor, there is a protective oxide 17 which is removed and replaced by a thin, high dielectric constant stack identified as 14. On each side of the gate structure comprising elements 14, 15 and 16, there is a spacer 18. Typically, this spacer is a robust dielectric like silicon nitride that has been etched anisotropically to leave walls of finite thickness on each side of the gate structure.

Within the current FDSOI practice there remain problems associated with low and variable access conductance beneath the gate spacers and with thickness control of the active layer. These problems are addressed by the structure and methods described below.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Figure 1:
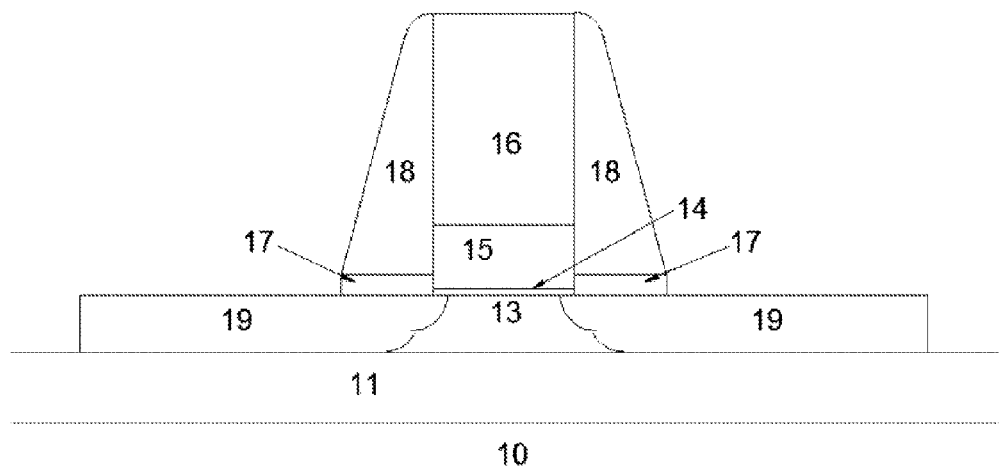
FIG. 1 is a schematic cross section of a prior art fully depleted SOI transistor (prior art).

The structure and the fabrication methods herein implement a fully depleted, recessed gate silicon-on-insulator (SOI) transistor with reduced access resistance, reduced on-current variability, and strain-increased performance. This transistor is based on an SOI substrate that has an epitaxially grown sandwich of SiGe and Si layers that are incorporated in the sources and drains of the transistors. Assuming a metal gate last complementary metal-oxide semiconductor (CMOS) technology and using the sidewall spacers as a hard mask, a recess under the sacrificial gate reaching all the way through the SiGe layer is created, and the high-K gate stack and metal gate are formed within that recess. The remaining Si region, having a precisely controlled thickness, is the fully depleted channel.

Embodiments of the invention provide for an improved, fully depleted SOI transistor based on a starting substrate having two thin, single crystal layers, one being silicon and the other silicon-germanium. Within this substrate, the transistor gate is formed in a recess in the upper of the two layers, controlling the conduction of carriers in the lower single crystal layer. The recess is defined laterally by the interior walls of the gate spacer, and its depth is controlled by the thickness of the upper single crystal layer. The processing is compatible with commonly known "Gate Last" technology. The two layers are typically epitaxial silicon adjacent to a buried oxide and beneath an epitaxial layer of SiGe. The completed device realizes fully depleted SOI transistors in the silicon layer, but has added source/drain thickness from the SiGe layer.

Embodiments of the invention that create a fully-depleted silicon on insulator transistors using a "Recessed Gate" process provide benefits that include, but are not limited to: accurate definition of the channel thickness due to epitaxial control of the thickness of the Si channel layer and the high (100:1) selectivity of the SiGe cap etching; reduced access resistance associated with the presence of the relatively thick cap layer containing source/drain doping; strain induced performance enhancement of the p-channel transistors due to compressive strain in the channel inserted by the SiGe cap layer; reduced on current variability due to the larger volume and larger number of dopants in the access regions which reduces the statistical access resistance variations; and, addressing a second source of fluctuations, those associated with the uncertainty of the location of the PN junctions that separate sources and drains from the bodies of their respective transistors.

The new structure differs from the prior art in the physical and electrical structure of the channel region of the thin-film, SOI transistor. This is illustrated in exemplary and non-limiting FIG. 2. The transistor is supported by a substrate 20 and a buried oxide 21. The Si channel region 23 is very lightly doped, i.e., less than $10^{17}$ doping ions/cm$^3$ and preferably less than $10^{16}$ doping ions/cm$^3$. The channel region is thinner than the source and drain access regions beneath the spacers 28, because the channel is in a recess separating the source and drain regions 29 and 22. The key elements of the transistor per se are the Si channel 23, a high-k gate stack 24, deposited in an isotropic process, a metal gate 25 and a gate handle 26. The source and drain regions are a composite of highly doped SiGe regions 29 and highly doped silicon regions 22. Regions 27 represent residual protective oxides from earlier process stages, and regions 28 are spacers, typically silicon nitride, that play an essential role in fabricating this transistor.

Figure 2:
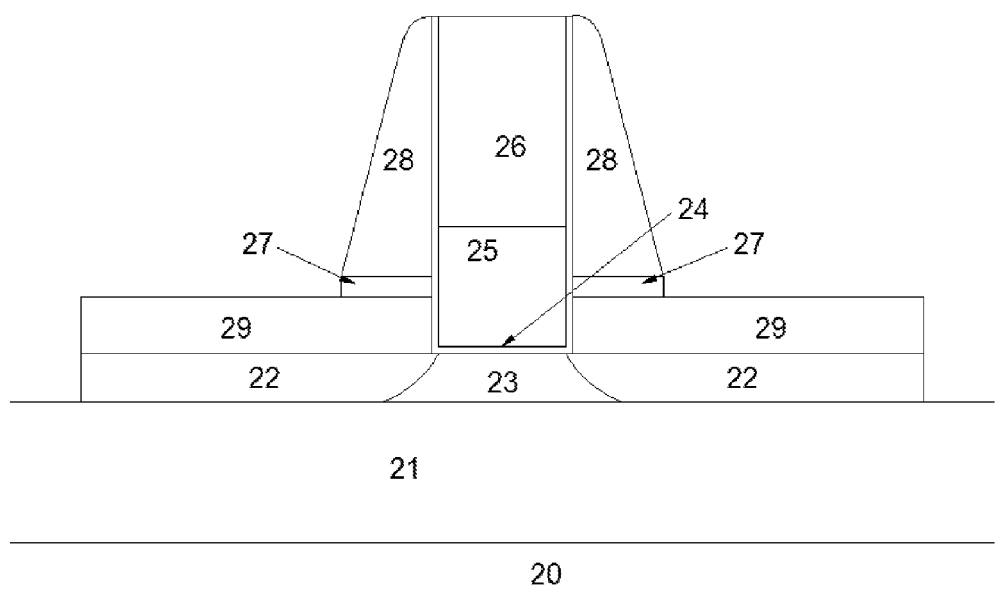
FIG. 2 is a schematic cross section of a transistor reflecting the structural improvements in this invention.

In FIG. 2 it should be noted that the source and drain regions are a composite, SiGe over Si. This two-layer configuration is responsible for the advantages inherent in the present invention. The SiGe cap layer plays multiple roles. Firstly, it facilitates the precise definition of the Si channel thickness using a combination of selective reactive ion etching and chemical etch with high selectivity in respect of the Si channel region. Secondly, the combination of heavy doping in the SiGe layer introduced through the extension implantation self-aligned to the dummy poly-Si gate and consequently activated reduces the access resistance and improves the device performance. Thirdly, The compressive strain introduced by the SiGe layer into the Si channel enhances the performance of the p-channel transistors. The close proximity of the SiGe layer to the Si channel increases the strain. The p-channel performance can be further improved by selective epitaxial growth of SiGe in the contact regions outside the spacer. Finally, the presence of heavily doped SiGe layer reduces the random dopant induced resistance variation of the portions of the sources and drains 29 and 22 that lie beneath the spacers 28 and therefore the on current fluctuations that may be serious problem in conventional, fully-depleted silicon on insulator transistors. The typical thickness of the SiGe layer is in the range of 5 nm to 15 nm. The maximum thickness depends on the composition of the SiGe layer, and it is chosen in a way to prevent the strain relaxation.

Figure 3:
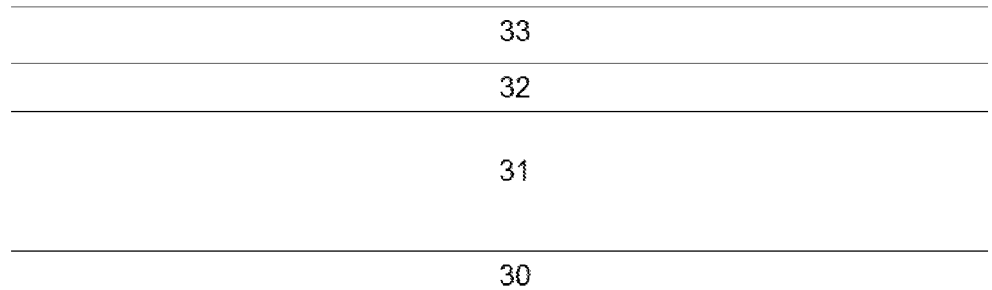
FIG. 3 is an exemplary cross section of a substrate upon which the novel transistor can be built.

The new structure utilizes an SOI substrate that is different from the substrate utilized in a conventional fully depleted SOI transistor. This is illustrated in FIG. 3. The mechanical substrate is region 30, typically a silicon wafer. Above the substrate there is a buried oxide, commonly called BOX, region 31. The active layer above the BOX layer comprises a 4-8 nm epitaxially grown Si channel region 32 and a 5-15 nm SiGe cap layer, identified as 33. The specific composition of this layer depends on its thickness, and the thickness is determined to manage the strain in this layer. This unusual substrate may be prepared in a variety of ways. One example that is representative of present SOI practice is the "Smart Cut" technology, first introduced by M. Bruel, "Silicon on insulator material technology," *Electronics Letters*, vol. 31, no. 14, pp. 1201-1202, (6 Jul. 1995). In this case, the first step would be to grow an epitaxial layer of Si:Ge (the cap layer 33) of the desired thickness on a sacrificial wafer. Then a layer of silicon is grown epitaxially over the SiGe. This layer has a design thickness that accommodates two elements, the BOX 31 and the channel layer 32. After oxidizing the silicon to form the BOX, the sacrificial wafer is implanted with hydrogen to depth just beneath the SiGe layer. The substrate 30 is a separate wafer that is bonded to the oxide 31 on the sacrificial wafer. In a subsequent heat process, the sacrificial wafer splits away from layers 33, 32, 31 and the substrate 30 due to the bubbling of the implanted hydrogen. Subsequent mechanical or chemical processes may be used to polish and planarize the SiGe surface. Apart from the incorporation of a SiGe epi layer, this fabrication technique is well known. Other paths are available to reach the same substrate configuration, including the epitaxial growth of SiGe layer 33 on an otherwise standard SOI substrate.

The ten illustrations identified as FIGS. 4A through 4J show a series of exemplary and non-limiting steps used to realize an embodiment of the improved transistor structure in FIG. 2.

Figure 4A:
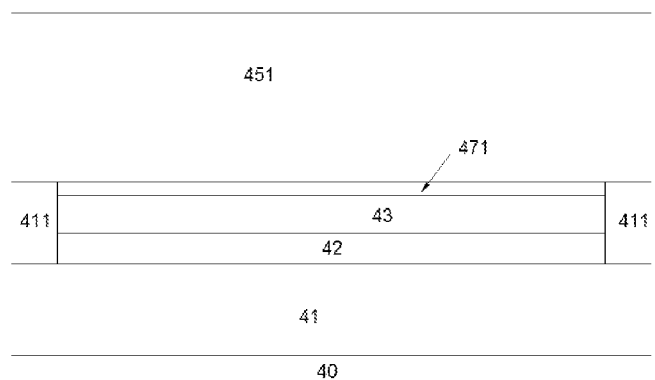
FIGS. 4A through 4J are schematic cross sections that illustrate a processing sequence by which the "Recessed Gate" structure is realized according to an embodiment.

FIG. 4A shows a substrate 40, and above that there is a buried oxide 41. Region 42 is single crystal silicon between 4 nm and 8 nm thick. Region 43 is a layer of single crystal Si:Ge. Its thickness is typically 5 nm to 15 nm. While the thickness plays a role in stress management and in source/drain conductance, it is less critical than the thickness of the underlying Si layer 42. Above the SiGe region 43, there is a layer of silicon dioxide 471. In a full process flow involving a variety of transistors, this oxide would play various roles. For the purposes of this explanation, it is referred to herein as a screen oxide. The thickness of this oxide is not critical for the present explanation, but it is assumed to be 3 nm thick. Overlying everything else there is a layer 451 of amorphous (preferably) or polycrystalline silicon. This layer is not to scale in the drawings, because it can range from 50 nm to 150 nm in thickness. Its thickness is not critical to the explanations that follow. With the exception of the Si and Si:Ge double layer, these procedures are well known to practitioners in SOI semiconductor activity.

Figure 4B:
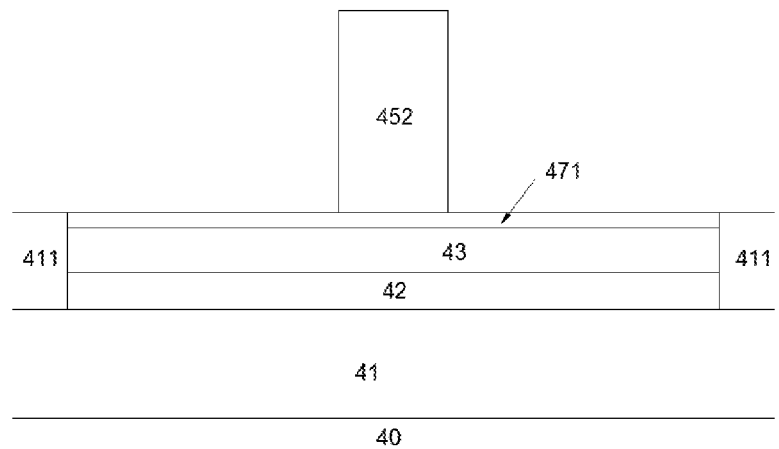

In FIG. 4B the amorphous silicon layer has been selectively (anisotropically) etched, using standard photo, electron beam or X-ray masking techniques to leave a sacrificial gate structure 452. As viewed in FIG. 4B, the width of element 452 defines the eventual channel length of the thin film transistor. This procedure is well known to practitioners in SOI semiconductor activity.

Figure 4C:
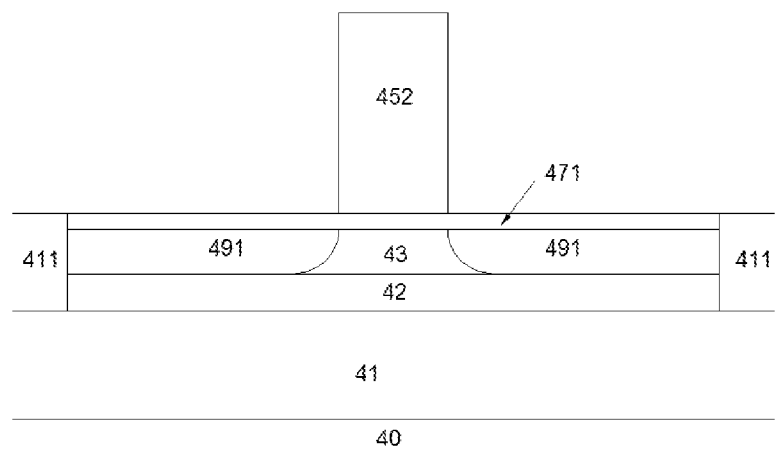

FIG. 4C shows the addition of an ion implantation 491. This implantation, which might be eliminated in certain transistor designs, plays a role in managing the doping of the underlying silicon region 42. This is an implantation of donors (phosphorus, arsenic or antimony) for NMOS transistors or acceptors (boron $BF_2^+$ or indium) for PMOS transistors that goes into the SiGe layer 43, and diffuses slightly during the later activation. It makes the SiGe layer 43 a solid state source of dopants to effect a drain extension adjacent to the active channel region which is formed in Si layer 42. Note that the implant is localized and excluded from the channel region by the masking effect of the sacrificial gate 452. Besides the local definition by the sacrificial gate, drain extension implants are dedicated to specific classes of transistors by photoresist masking. These procedures are well known to practitioners in SOI semiconductor activity.

Figure 4D:
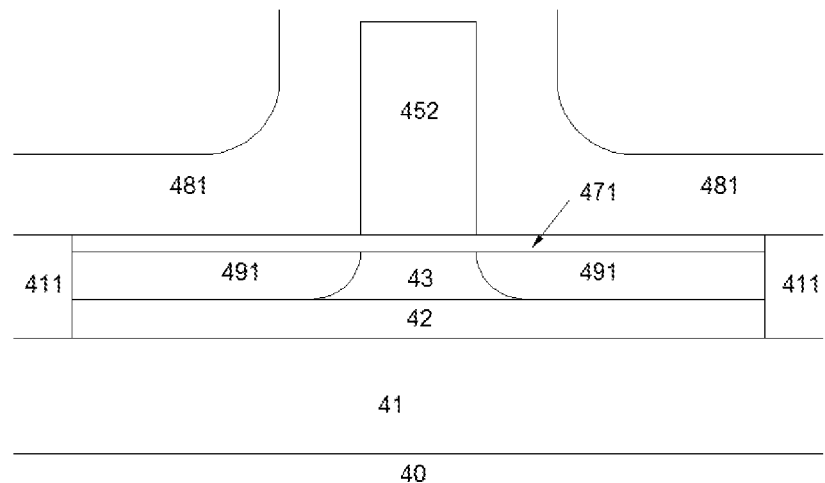

FIG. 4D shows the deposition of dielectric layer 481. This layer is typically silicon nitride, and it may be deposited by either chemical vapor deposition or plasma enhanced CVD. The latter process is preferred in order to preclude crystal growth in the sacrificial gate 452. This is the material that provides the spacers 18 and 28 in FIGS. 1 and 2 respectively. The thickness of layer 481 determines in large part the eventual width of the spacers. Typical thicknesses might range from 10 nm to 200 nm. This procedure is well known to practitioners in SOI semiconductor activity.

Figure 4E:
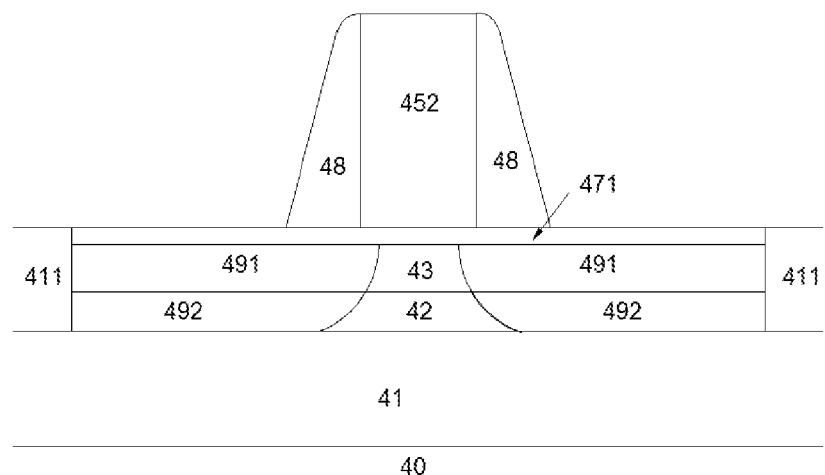

FIG. 4E shows the effect of planarizing by a chemical-mechanical polishing (CMP) process and anisotropically etching on layer 481. Where its surface was flat (horizontal), the material 481 is cleared, but where it covers a vertical surface, there is a wedge 48 of material left. This is commonly known as a gate spacer. This procedure is well known to practitioners in SOI semiconductor activity.

FIG. 4E also shows the addition of the heavy source and drain implants 492. These implants are typically the heaviest implants in the process flow, of the order of $1\times10^{15}$ ions/cm$^2$ or higher. The species are phosphorus or arsenic for NMOS transistors and boron (sometimes as $BF_2^+$) for PMOS transistors. Within each specific transistor, this implant is localized by the masking effect of the spacers 48 and the sacrificial gate 452. The dose and energy of this implant are typically tailored to assure its reaching clear through the SiGe layer 43 and Si layer 42 after activation. After this implant and other related implants on the wafer are done, they are all activated by one of the various rapid thermal annealing processes (tungsten halogen, xenon flash or laser) that are currently in use. This procedure is well known to practitioners in SOI semiconductor activity. The doping profile of the source and drain adjacent to the ultimate gate region is a designable function of the two implants 491 and 492 and the activation thermal exposure. The total thickness of both the Si 42 and SiGe 43 layers is available to form a conductive path in and out of the ultimate active transistor region.

Figure 4F:
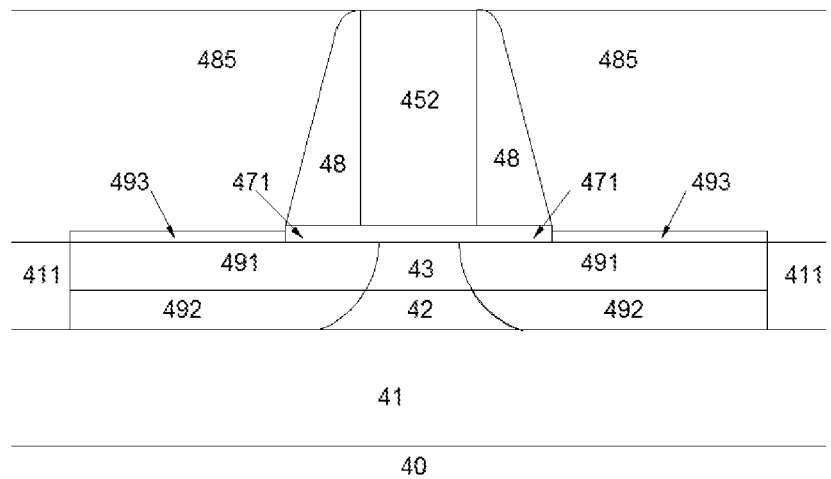

FIG. 4F shows the consequence of several steps. First, the screen oxide 471 is removed by either wet or dry etching except where it is protected by the spacers 48 and the sacrificial gate 452, leaving the remaining piece 471 of the screen oxide. After that a reactive metal, typically nickel is deposited, then heated to form a highly conductive metal-silicide layer 493. This is one typical method of enhancing the conductivity of the sources and drains 491/492 of the transistors. An alternative procedure, not otherwise illustrated here, involves using epitaxial growth on the surface characterized by label 493 to significantly increase the thickness and conductivity of the thin sources and drains. After the source and drain conductivity enhancement is complete, a dielectric layer 485 is deposited, typically by plasma enhanced chemical vapor deposition. Layer 485 is the first interlayer dielectric. After deposition, layer 485 is planarized by a chemical-mechanical polishing (CMP) process. This exposes the top of the sacrificial gate 452. These procedures are well known to practitioners in SOI semiconductor activity.

Figure 4G:
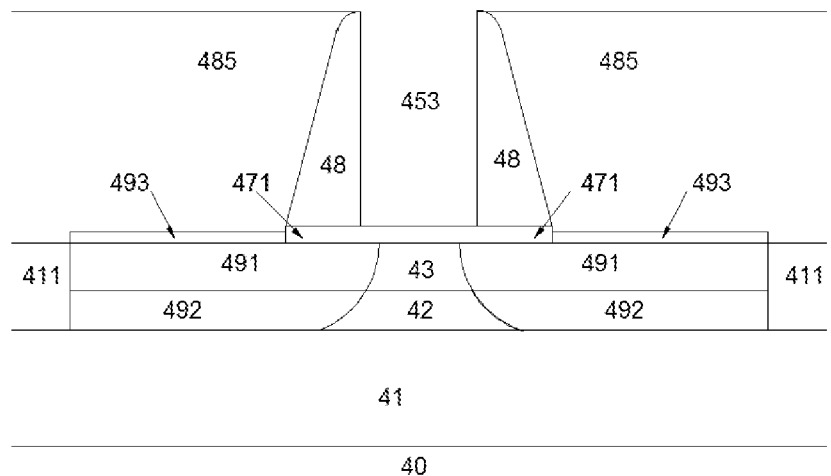

At this stage, as shown by FIG. 4G, the sacrificial gate is selectively etched away, leaving the cavity identified as region 453. This step is commonly used in the class of processes known as "Gate Last" processes.

Figure 4H:
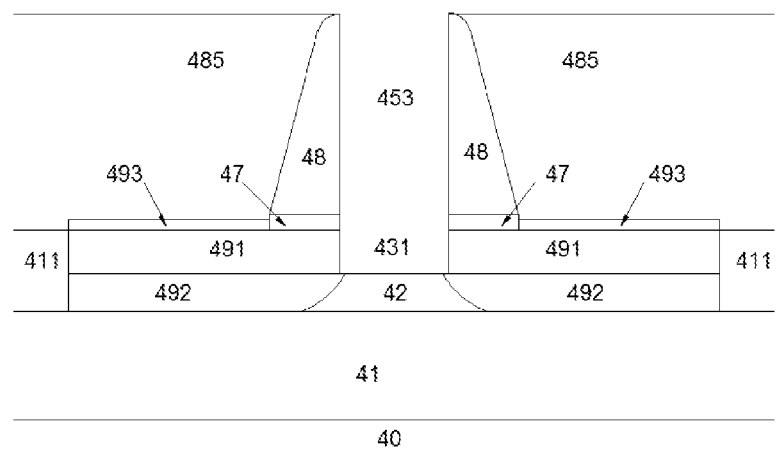

FIG. 4H shows the next deviation from previously known processes. Using the first interlayer dielectric 485 and the spacers 48 as hard masks, the screen oxide 471 is etched through the cavity 453, leaving the residual sections 47 under the spacers 48. This clears the surface of the underlying silicon-germanium layer 43, which is subsequently etched in a controlled fashion to create the recess 431. Both of these etching steps are preferably done with anisotropic processes in order to carry the profile of the spacers 48 into the recess 431. The depth of the recess is controlled by using an etch that selectively etches the Si:Ge 43 without attacking the underlying silicon 42. Etches with selectivity ratios of 100:1 are available, and this selectivity helps maintain a precise thickness for the channel region 42, previously cited in the range of 4 nm to 8 nm.

Figure 4I:
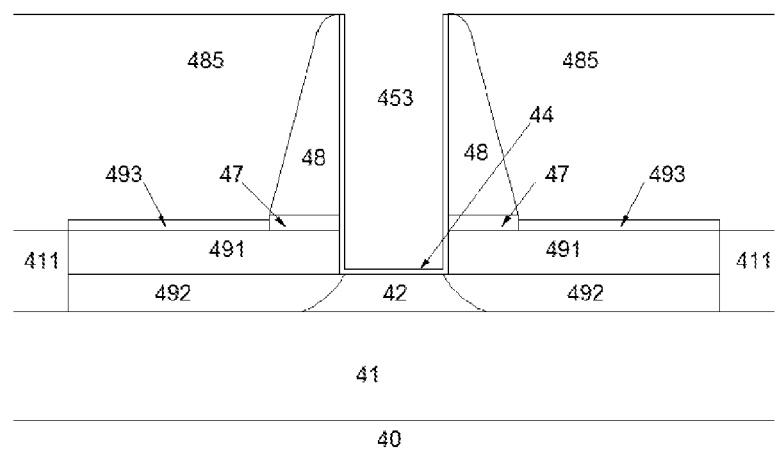

The next step in creating a Recessed Gate structure is shown in FIG. 4I. A high-K gate dielectric stack 44 is formed within the cavities 453 and 531. This deposition may involve one or more layers, and the ultimate effective dielectric constant may be expected to be greater than 6. High K dielectrics are commonly used in sub-40 nm CMOS processes, and they frequently include compounds of hafnium, as $HfO_2$, HfON, HfLaO and others. The deposition of this gate dielectric layer 44 must be isotropic so the walls of the 453/431 recess are covered as well as its bottom.

Figure 4J:
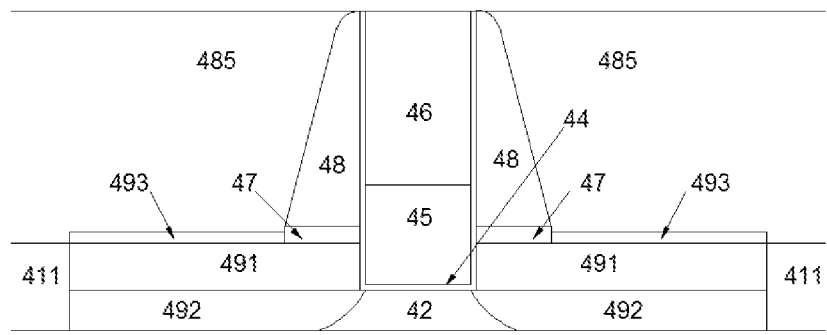

The transistor is completed like any other "Gate Last" transistor as shown in FIG. 4J. The next layer is a metal gate 45, which is formulated to achieve specific work functions in order to set the threshold voltage. This layer must be thick enough to totally fill the recess within the SiGe zone 491, and it may consist of one or more layers of metallic materials. One commonly used metallic material is TiN, but hafnium, ruthenium, TaN, MoN and WN also arise as candidates. The final material is a gate handle 46, which is typically amorphous or poly-crystalline silicon. This material protects the underlying metal from chemical or mechanical damage. It also provides electrical connection to the metal gate 45. After all of layers 44, 45 and 46 have been deposited, it is normal to use a CMP process to restore the planar surface of the first interlayer dielectric 485. All of the steps associated with FIG. 4J are well known to practitioners of High-K, metal gate semiconductor science and engineering, although the thickness of the metal gate 45 may be thicker than normal practice.

It is well known that, subsequent to forming the structure shown in FIG. 4J, other steps are necessary to complete the integrated circuit. These include adding a second interlayer dielectric, creating contacts, and adding multiple layers of metal interconnect.

Referring back to FIG. 2, it should be recognized that the essential properties of this structure do not depend upon the specific materials used to fabricate the gate dielectric 24 or the gate electrode 25. The description has been written in the context of High-K Metal Gate technology because that is the prevalent materials strategy used in combination with Gate Last processing.

It will be appreciated that there are a variety of approaches to realizing a structure possessing the essential properties of the "Recessed Gate" SOI transistor described in the paragraphs above. Alternative single crystal layers may be used as long as device quality, single crystal semiconductors can realized, particularly for the layer identified variously as 22, 32 or 42. For instance, making layer 32 SiGe and making layer 33 Si, reverses the sequence described in FIG. 3.

Further, the recessed gate structure can be realized on a bulk silicon substrate by preparing it with an overlying epitaxial layer of SiGe. In this case, the advantages associated with a fully-depleted, insulated channel region will not be available, but the other virtues of this structure will be preserved.

What is claimed is:

1. A metal-oxide-semiconductor field effect transistor (MOSFET) comprising:
a fully depleted semiconductor on insulator (FDSOI) substrate having a first semiconductor layer on a second semiconductor layer that is on an insulator layer, which insulator layer is on an underlying substrate, wherein the second semiconductor layer is a silicon layer and the first semiconductor layer is a silicon-germanium layer, or wherein the second semiconductor layer is a silicon-germanium layer and the first layer is a silicon layer;
a source region and a drain region formed in the second semiconductor layer having a second dopant level implant establishing a second dopant concentration in the source and drain regions formed in the second semiconductor layer; and a source region and a drain region formed in the first semiconductor layer having a first dopant level implant establishing a first dopant concentration in the source and drain regions formed in the first semiconductor layer;
a semiconductor channel region in the second semiconductor region separating the source and the drain regions;
the second semiconductor layer having a thickness for fully depleted operation and wherein the semiconductor channel region extending through the second semiconductor layer to the insulator layer;
a silicide layer formed over at least a portion of the source region formed in the first semiconductor layer and a silicide layer formed over the drain region formed in the first semiconductor layer;
a gate dielectric over the semiconductor channel region; and,
a conductive gate region over the gate dielectric, the gate dielectric also separating the conductive gate from the first semiconductor layer adjacent the conductive gate;
wherein a cross-section of a MOSFET of a first conductivity type and a cross-section of a MOSFET of a second conductivity type may have the same cross-section, layer for layer, other than the conductivity types and possible reversal of the position of the silicon and the silicon-germanium layers.

2. The MOSFET of claim 1 wherein the source and drain regions extend through the second semiconductor layer to the insulator layer.

3. The MOSFET of claim 1, further comprising
a pair of passive spacers above the first semiconductor layer, each having substantially vertical faces spaced apart and defining a length of the conductive gate region.

4. The MOSFET of claim 3, wherein the gate dielectric and the metal gate fill an etched recess through the first semiconductor layer between the spacers to the semiconductor channel region.

5. The MOSFET of claim 4 wherein the gate dielectric is one or more dielectric layers having an effective dielectric constant greater than 6.

6. The MOSFET of claim 5 wherein the conductive gate region is a metal gate region.

7. The MOSFET of claim 5 wherein the conductive gate region is a silicon gate region.

8. A metal-oxide-semiconductor field effect transistor (MOSFET) comprising:
a fully depleted semiconductor on insulator (FDSOI) substrate having a silicon-germanium semiconductor layer on a silicon semiconductor layer that is on a buried oxide layer, which buried oxide layer is on an underlying substrate;
a source region and a drain region extending from the silicon-germanium semiconductor layer of the FDSOI substrate through the silicon semiconductor layer of the FDSOI substrate to the buried oxide layer;
a semiconductor channel region in the silicon semiconductor region separating the source and the drain regions;
the silicon semiconductor layer having a thickness for fully depleted operation and wherein the semiconductor channel region extending through the silicon semiconductor layer to the buried oxide layer;

a silicide layer formed over at least a portion of the source region formed in the silicon-germanium semiconductor layer and a silicide layer formed over the drain region formed in the silicon-germanium semiconductor layer;

a gate dielectric over the semiconductor channel region and edges of the silicon-germanium layer; and, a conductive gate region over the gate dielectric, the gate dielectric also separating the conductive gate from the silicon-germanium semiconductor layer adjacent the conductive gate;

wherein a cross-section of a MOSFET of a first conductivity type and a cross-section of a MOSFET of a second conductivity type has the same layer for layer other than the conductivity types.

9. The MOSFET of claim 8, further comprising a pair of passive spacers above the silicon-germanium semiconductor layer, each having substantially vertical faces spaced apart and defining a length of the conductive gate region.

10. The MOSFET of claim 9, wherein the semiconductor channel region is in an etched recess through the silicon-germanium layer having a lateral dimension defined by the distance between the passive spacers.

11. The MOSFET of claim 8 wherein the gate dielectric is one or more dielectric layers having an effective dielectric constant greater than 6.

12. The MOSFET of claim 3 wherein the semiconductor channel region is in an etched recess through the first semiconductor layer having a lateral dimension defined by the distance between the pair of passive spacers.

13. The MOSFET of claim 1 in which the semiconductor channel region has a thickness between 4 nm and 8 nm.

14. The MOSFET of claim 10, wherein the gate dielectric and silicon semiconductor channel region fill an etched recess through the silicon-germanium layer to the silicon semiconductor layer between the spacers.

15. The MOSFET of claim 8 in which the silicon semiconductor channel region has a thickness between 4 nm and 8 nm.

* * * * *